| United States Patent [19] | [11] Patent Number: 4,946,728 |
| Ikeda et al. | [45] Date of Patent: Aug. 7, 1990 |

[54] ADHESIVE PAPER FOR COPYING

[75] Inventors: Takeshi Ikeda; Akira Nozaki; Kazuyoshi Ebe, all of Saitama, Japan

[73] Assignee: FSK Kabushiki Kaisha, Tokyo, Japan

[21] Appl. No.: 213,289

[22] Filed: Jun. 28, 1988

Related U.S. Application Data

[63] Continuation-in-part of Ser. No. 80,014, Jul. 31, 1987, abandoned.

[30] Foreign Application Priority Data

Aug. 1, 1986 [JP] Japan .................................. 61-181393
Apr. 22, 1987 [JP] Japan .................................. 62-098884

[51] Int. Cl.$^5$ .......................... B32B 3/06; B32B 3/08; B32B 7/06; B32B 7/12
[52] U.S. Cl. .................................... 428/40; 428/84; 428/192; 428/211; 428/345; 428/514
[58] Field of Search ............ 428/211, 192, 345, 537.5, 428/84, 352, 40, 194, 514

[56] References Cited

U.S. PATENT DOCUMENTS 4,624,893 11/1986 Shibano et al. ............... 428/537.5 X
4,713,274 12/1987 Minor ............................. 428/192 X

OTHER PUBLICATIONS

Japanese Laid Open Publication (Abstract) 159,874/84.
Japanese Laid Open Publication (Abstract) 10,353/75.

*Primary Examiner*—George F. Lesmes
*Assistant Examiner*—J. Davis
*Attorney, Agent, or Firm*—Wenderoth, Lind & Ponack

[57] ABSTRACT

In an adhesive paper for copying prepared by laminating an overlying sheet with a release sheet so that an adhesive layer coated on the bottom surface of said overlying sheet is in contact with the releasing surface of said release sheet, the improvement comprising a radiation-induced polymer layer having a glass transition temperature ranging from 50° to 200° C., applied to at least one edge face of said adhesive paper for copying, said radiation-induced polymer layer being formed by applying a solvent free radiation polymerizable composition to said edge face followed by irradiation curing. The presence of the radiation-induced polymer layer prevents an adhesive from squeezing out. The polymer layer, because of its specific glass transition temperature, will not break and fall off. Thus a copying machine will not be contaminated with squeezed adhesive or broken and fallen polymer layer during copying. Further, the solvent-free and radiation polymerizable nature of the polymer layer-forming composition ensures the sheets not to curl.

15 Claims, 1 Drawing Sheet

ADHESIVE PAPER FOR COPYING

RELATED APPLICATION

This application is a continuation-in-part to our pending application Ser. No. 080,014 filed on July 31, 1987, which is abandoned.

FIELD OF THE INVENTION

This invention relates to adhesive papers for copying and more particularly to adhesive papers for copying which will not contaminate a cylindrical photoreceptor of copying machine therewith when the adhesive papers for copying are fed to the copying machine.

BACKGROUND OF THE INVENTION

Usually, adhesive papers for copying prepared by laminating an overlying sheet with a release sheet so that an adhesive layer coated on the bottom surface of said overlying sheet is in contact with the releasing surface of said release sheet are subjected on the surface of the overlying sheet to copying with a copying machine, the release sheet is then peeled off therefrom and the copied overlying sheet is applied to a desired place.

In preparing adhesive papers for copying having the structure as mentioned above, acrylic or rubber adhesives have heretofore been used to form adhesive layers to be coated on the bottom surface of the overlying sheet of said adhesive papers. The adhesive papers for copying prepared by using such adhesives, however, involved such a serious problem that when they are brought into contact with a cylindrical photoreceptor of copying machine, the adhesives sometimes squeeze out of the edge face of the adhesive papers to contact with the cylindrical photoreceptor, with the result that the cylindrical photoreceptor of the copying machine is contaminated with the squeezed adhesives. In addition thereto, there was also such a problem that the adhesive Papers for copying of the type undergo heating at the time of fixing the toner, and if the adhesives used in said adhesive papers are low in heat resistance, they sometimes squeeze out of the edge face of the adhesive papers, Whereby the toner fixing equipment comes to be contaminated with the squeezed adhesives.

In order to solve the problems associated with adhesive papers for copying of the prior art mentioned above, various improvements have been proposed. For instance, Japanese Laid-Open-to-Public Publn. No. 159874/1984 discloses adhesive papers for copying which are characterized in that the edge face of the adhesive papers is provided with a coating layer to inhibit squeeze-out of the adhesive from the adhesive papers, said coating layer comprising a cellulose derivative coating such as nitrocellulose, and acetylcellulose, an organic solvent based synthetic resin coating such as thermosetting acrylic resin, and phenol-formaldehyde resin, or a water based synthetic resin coating such as vinyl acetate resin. and styrenebutadiene copolymer.

In the adhesive papers for copying disclosed in Japanese Laid-Open-to-public publn. No. 159874/1984 referred to above, however, there was involved such a problem that the coating applied to the edge face of the adhesive papers sometimes permeates into the overlying sheet, adhesive layer and release sheet, and hence protection of the edge face becomes insufficient, thereby the adhesive of the adhesive layer of the adhesive papers squeezes out in some cases. Furthermore, another problem also involved therein was such that the overlaying sheet and release sheet come to curl by application of heat when the coating applied to the edge face of the adhesive papers is cured by heating.

On one hand, although they are not adhesive papers for copying, disclosed in Japanese Patent Publication No. 10353/1975 are lap winding adhesive tapes which are characterized in that the edge face of the adhesive tapes is coated with an organic solvent containing a photocrosslinking sensitizer, photochemical crosslinking agent and vinyl type high molecular compound, and the coating formed on the edge face is cured by irradiation, thereby inhibiting squeeze out of the adhesive from the edge face of the adhesive tapes. However, if this technique is intended to apply to adhesive papers for copying, there was such a problem that the organic solvent used permeates into the overlying sheet or release sheet of the adhesive papers, whereby the overlying sheet or release sheet undergoes curling and, at the same time, an environmental pollution is brought about by the use of the organic solvents.

According to experiments conducted by the present inventors, it has been found that adhesive papers for copying having a radiation-induced polymer layer formed on the edge face of the adhesive papers by irradiating radiation polymerizable compounds such as epoxy compounds are fed to a copying machine, whereupon the radiation-induced polymer layer is broken in some cases and falls off from the adhesive papers when the adhesive papers are fed to a copying machine and pressed against a cylindrical photoreceptor, thereby the cylindrical photoreceptor is contaminated with the fallen radiation-induced polymer layer in certain cases.

With the view of solving such problems as referred to above at a single stroke, the present inventors conducted extensive researches and eventually have found that said problems can be solved at once by providing at least one edge face of adhesive papers for copying with a resin layer formed by using radiation polymerizable compositions capable of providing a resin layer having a glass transition temperature prescribed herein, but without using any solvents. Thus, the present invention has been accomplished

OBJECT OF THE INVENTION

The present invention is intended to solve the above-mentioned problems associated With the prior art, and an object of the invention is to provide adhesive papers for copying which have been improved in that no adhesive of the adhesive layer will not squeeze out from the edge face of the adhesive papers and consequently a cylindrical photoreceptor and other parts of copying machine will not be contaminated with the squeezed adhesive and, moreover, that the overlying sheet or release sheet of the adhesive papers will not undergo curling as no organic solvents which have conventionally been used in the resin layer applied to the edge face of adhesive papers and which have permeated into the overlying sheet or release sheet are used.

SUMMARY OF THE INVENTION

Thus, the invention provides an improvement in an adhesive paper for copying prepared by laminating an overlying sheet with a release sheet so that an adhesive layer coated on the bottom surface of said overlying sheet is in contact with the releasing surface of said release sheet, said improvement comprising a radiation-induced polymer layer having a glass transition temperature ranging from 50° to 200° C., applied to at least one edge face of said adhesive paper for copying, said radiation-induced polymer layer being formed by applying a solvent free radiation polymerizable composition to said edge face followed by irradiation curing, said radiation polymerizable composition comprising a radiation polymerizable prepolymer and from 1 to 300 parts, preferably from 5 to 200 parts by weight, based on 100 parts by weight of said prepolymer, of at least one radiation polymerizable monomer.

In the adhesive papers for copying of the present invention, at least one edge face of the adhesive papers is provided With a radiation-induced polymer layer formed by applying a radiation polymerizable composition on said edge face followed by irradiation curing. Because this radiation-induced polymer layer formed on the edge face has a glass transition temperature of from 50° up to 200° C., the adhesive of the adhesive later is prevented from squeezing out from said edge face of the adhesive papers for copying and, at the same time, said radiation-induced polymer layer is inhibited to break and fall off from said edge face even when a pressure is applied to the adhesive papers for copying during copying operation thereof. Accordingly, a cylindrical photoreceptor or the like equipments of a copying machine will not be contaminated with the squeezed adhesive or segments of the broken and fallen radiation-induced polymer layer. Moreover, since the radiation polymerizable compositions used do not contain organic solvents or water, the overlying sheet and release sheet of the adhesive papers for copying do not require drying thereof and, at the same time, these sheets will not undergo curling by getting wet with the organic solvents or water. In addition, since the radiation polymerizable compositions are cured by irradiation and not by heating, the adhesive papers for copying are not exposed to elevated temperatures and thus the overlying sheet and release sheet will not curl, as well.

Further if the irradiation polymerizable compositions contain a coloring agent. it is very easy to confirm whether a radiation-induced polymer layer is surely provided on at least one edge face of the adhesive papers for copying.

DETAILED DESCRIPTION OF THE INVENTION

Figure 1:
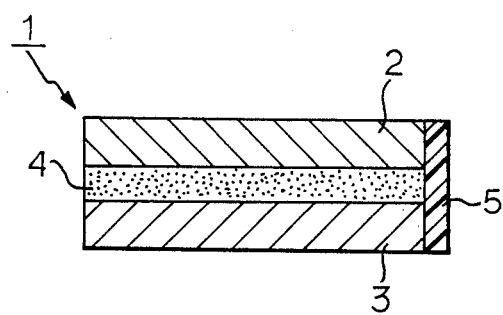
FIG. 1 is a cross-sectional view of the adhesive paper for copying of the present invention, in which reference numerals designate: 1 ... Adhesive paper for copying 2 ... Overlying sheet 3 ... Release sheet 4 ... Adhesive layer 5 ... Radiation-induced polymer layer

The adhesive papers for copying of the present invention are illustrated in more detail hereinafter.

As shown in FIG. 1, an adhesive paper for copying 1 prepared according to the present invention comprises an overlying sheet 2 and a release sheet 3, wherein said overlying sheet and said release sheet are laminated together so that an adhesive layer 4 coated on the bottom surface of the overlying sheet 2 in contact with the releasing surface of the release sheet 3, and at least one edge face of this adhesive paper for copying 1 is provided with a radiation induced polymer layer 5 cured by irradiation.

The radiation-induced polymer layer 5 is formed by applying a radiation polymerizable composition on the edge face of the adhesive paper for copying 1, followed by irradiation curing.

The radiation polymerizable composition used for forming the radiation-induced polymer layer 5 contains a radiation polymerizable prepolymer and from 1 to 300 parts, preferably from 5 to 200 parts by weight, based on 100 parts by weight of said prepolymer, of at least one radiation polymerizable monomer. This radiation polymerizable composition may further contain a polymerization initiator in addition to the above-mentioned components.

The radiation polymerizable prepolymer used in the radiation polymerizable composition may comprise a urethane acrylate oligomer. The urethane acrylate oligomer can be obtained by reacting a urethane prepolymer having terminal isocyanate groups, which is obtained by reacting a polyol compound, such as polyesters, polyethers, low molecular alkyds, silicone resins or epoxy resins with a polyisocyanate, for example, 2,4-tolylene diisocyanate, 2,6-tolylene diisocyanate, 1,3-xylylene diisocyanate, 1,4-xylylene diisocyanate, and diphenylmethane 4,4-diisocyanate, with a hydroxyl-containing (meth)acrylate, for example, 2-hydroxyethyl acrylate, 2-hydroxyethyl methacrylate, 2-hydroxypropyl acrylate, 2-hydroxypropyl methacrylate, polyethylene glycol acrylate, and polyethylene glycol methacrylate.

The urethane acrylate oligomers have at least one carbon-carbon double bond.

The urethane acrylate oligomers desirably have a molecular weight of 1000–10,000, preferably 1,000–5,000 or thereabouts.

As the radiation polymerizable prepolymer, there may be used, under certain circumstances, a mixture of the urethane acrylate oligomer with up to 50% by weight, based on the weight of the mixture, of at least one oligomer selected from polyester acrylate, epoxy acrylate, and silicone acrylate oligomers. These oligomers desirably have a molecular weight of 1,000–10,000, preferably 1,000 to 5,000.

Examples of the radiation polymerizable monomers which can be used herein include, for example, trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, commercially available digoester acrylates having a moleculare weight of 300–700, N-vinyl-2-pyrrolidone, 2-ethylhexyl acrylate, nonylphenoxy polyethylene glycol acrylate, and 2-hydroxyethyl acrylate.

A polymerization initiator may be used in the radiation polymerizable composition. Usable polymerization initiators are radical forming polymerization initiators and ionic polymerization initiators.

Usable radical forming polymerization initiators include, for example, benzophenone, benzoin ether and acetophenone compounds such as 2,2-diethoxyacetophenone, benzophenone, 4,4-bisdimethylamino benzophenone, benzyl, dibenzoyl, benzoin methyl ether, benzyl dimethyl ketal, 1-hydroxycyclohexylphenyl ketone, etc. or azo compounds.

Usable ionic polymerization initiators concretely include acids, alkali metals, alkyl metals, etc.

The polymerization initiators as exemplified above are preferably used in the radiation polymerizable compositions in an amount of 0–10% preferably 1–10% by weight In the present invention, moreover, there may be also used a sensitizer in the radiation polymerizable composition. Usable sensitizers are amines such as triethylamine, diethylaminoethyl methacrylate, triethylene tetraamine, urea compounds, sulfur compounds, nitrile compounds, phosphorus compounds, and chlorine compounds.

The sensitizers as illustrated above are preferably used in the radiation polymerizable composition in an amount of 0–10% by weight.

Furthermore, if necessary, a stabilizer may be used in the radiation polymerizable composition, as well. Usable stabilizers are quaternary ammonium chlorides, hydroquinone, diethylhydroxylamine, benzothiazole, and hydroquinone monomethyl ether.

Such stabilizers are preferably used in the radiation polymerizable composition in an amount of 0–2% by weight.

In addition, a coloring agent may be used in the radiation polymerizable composition, as well. Usable coloring agents are dyes having visible color, fluorescence dyes and pigments.

Examples of the dyes having visible color include diphenylmethane dyes, triphenylmethane dyes, thiazole dyes, basic dyes, quinoline dyes, nitro dyes, and acidic dyes.

Examples of the fluorescence dyes include 2.5-bis(5-t-butylbenzoxazolyl(2)) thiophene, aromatic heterocyclic compounds, naphthalimide fluorescence dyes, 2-furyl-(3-p-anisoyl)chromene and diphenylchloromethyl-1,3,4-oxathiazol.

The pigments referred to above may be organic or inorganic pigments and include azo pigments, copper phthalocyanine pigments, thiooxazine pigments, condensated azo pigments, chromate pigments, ferrocyanate pigments, and metal oxide pigments.

The coloring agents illustrated above are preferably used in the radiation polymerizable composition in an amount of 0.005–2.0% by weight.

Where the coloring agent is in the radiation polymerizable composition, it is very easy to confirm whether a radiation-induced polymer layer 5 is surely provided on at least one edge face of the adhesive papers for copying, since the layer 5 has visible color or the layer 5 will have visible color when it is exposed to ultraviolet ray.

The radiation polymerizable composition containing the above-mentioned components is applied onto the edge face of adhesive paper for copying and then cured by irradiation to form a radiation-induced polymer layer on said edge face, said radiation-induced polymer layer as formed having a glass transition temperature of 50°–200° C., preferably 70°–150° C., and more preferably 80°–130° C. The use of a radiation-induced polymer layer having a glass transition temperature exceeding 200° C. is not preferable, because the radiation-induced polymer layer breaks and falls off from the edge face of adhesive paper for copying, on which it has been formed, when the adhesive paper for copying is fed to a copying machine and pressed against a cylindrical photoreceptor of the copying machine. On the one hand, the use of a radiation induced polymer layer having a glass transition temperature below 50° C. is not preferable, because a blocking phenomenon is observed at the edge face of adhesive paper for copying when the radiation-induced polymer layer is applied to said edge face, or the adhesive of the adhesive layer of the adhesive paper cannot be inhibited to squeeze out from said edge face.

The radiation-induced polymer layer having a glass transition temperature falling within the above-mentioned range may be formed by selecting the prepolymer and monomer components as well as their proportions in the radiation polymerizable composition. We have found that with a prepolymer comprising a urethane acrylate oligomer (up to about 50% by weight of which may be replaced with at least one oligomer selected from polyester acrylate, epoxy acrylate and silicone acrylate oligomers), use of a monomer selected from polyethylene glycol diacrylate, 2-ethylhexyl acrylate, nonylphenoxy-polyethylene glycol acrylate and 2-hydroxyethyl acrylate, alone or in combination with other radiation polymerizable monomers, is advantageous in facilitating adjustment of a glass transition temperature of the resulting radiation-induced polymer layer.

The process for the preparation of the adhesive papers for copying of the present invention is illustrated hereinafter.

An overlying sheet 2 and a release sheet 3 are laminated together so that an adhesive layer 4 coated on the bottom surface of said overlying sheet is in contact with the releasing surface of said release sheet, and at least one edge face of the laminate thus obtained is coated with a radiation polymerizable composition containing such components as mentioned hereinbefore.

The radiation polymerizable composition may be applied on the edge face of the laminate by such coating technique as brushing, spraying or silk screen process in case where the laminated adhesive paper for copying is in the form of roll. Alternatively, a roll stock adhesive paper for copying in the sheet cut line is continuously coated, prior to sheet cutting, on the edge face with the radiation polymerizable composition.

Furthermore, it is preferable in this connection that the edge face of adhesive paper for copying, to which the radiation polymerizable composition has been coated, is additionally subjected to smoothing operation by contacting said edge face with a felted fabric or sponge impregnated with said radiation polymerizable composition so that the edge face may be coated uniformly with the radiation polymerizable composition. Subsequently, the radiation polymerizable composition thus coated on the edge face of the adhesive paper for copying is irradiated with ultraviolet light (UV) or electron beam (EB), whereupon said composition is cured to form a radiation-induced polymer layer on said edge face by polymerization of the radiation polymerizable prepolymer and radiation polymerizable monomer contained in the radiation polymerizable composition.

EFFECT OF THE INVENTION

In the adhesive papers for copying of the present invention, at least one edge face thereof is coated with a radiation polymerizable composition containing specific components and this composition is then cured by irradiation to form a radiation-induced polymer layer having a specific glass transition temperature. By virtue of the presence on the edge face of the radiation-induced polymer layer, an adhesive of the adhesive layer of the adhesive papers for copying is inhibited to squeeze out from said edge face, and because of its specific glass transition temperature, the radiation-induced polymer layer will not break and fall off from the edge face even when the adhesive papers for copying are fed to a copying machine and pressed against a cylindrical photoreceptor of the copying machine, and consequently the cylindrical photoreceptor and other parts of the copying machine will not be contaminated with the squeezed adhesive or segments of the broken and fallen radiation-induced polymer layer. Moreover, the radiation polymerizable composition used do not contain organic solvent or water, the overlying sheet and release sheet do not require drying operation thereof and will not undergo curling by getting wet with the organic solvent or water and, in addition, the overlying sheet and release sheet will not curl because the radiation polymerizable composition is cured by irradiation and not by heating and the overlying sheet and release sheet are not exposed to elevated temperatures In addition, where a coloring agent is in the radiation polymerizable composition, it is very easy to confirm whether the radiation-induced polymer layer is surely provided on at least one edge face of the adhesive papers for copying.

The present invention is illustrated below with reference to examples, but it should be construed that the invention is in no way limited to those examples.

EXAMPLE 1

A radiation polymerizable composition comprising a mixture of 40 parts by weight of a urethane acrylate type oligomer having a Weight average molecular weight of 4,000 (in terms of polystyrene), 60 parts by weight of oligoester acrylate having a molecular weight of about 400, 20 parts by weight of N-vinyl-2-pyrrolidone and 6 parts by weight of benzyl dimethyl ketal was applied on the edge face of an adhesive paper for copying prepared by laminating an overlying sheet with a release sheet while interposing an acrylic adhesive therebetween. Thereafter, this edge face was subjected to smoothing operation by pressure contacting with a felted fabric impregnated with the same radiation polymerizable composition as mentioned above, and the edge face thus treated was irradiated for about 1 second with light of a 80 W/cm high pressure mercury lamp at a distance of 3 cm, whereby an adhesive paper for copying having formed a radiation-induced polymer layer on the edge face thereof was prepared.

The thus formed radiation-induced polymer layer had a glass transition temperature of 150° C.

This adhesive paper for copying was subjected to copying with a copying machine to examine adhesion characteristics, curl characteristics, traveling property and image property of the adhesive paper, and whether a cylindrical photoreceptor of the copying machine was contaminated with the adhesive or not. The traveling and image properties of the adhesive paper for copying, and the existence of contamination of the cylindrical photoreceptor were examined by using 200 sheets of the adhesive paper for copying. The existence of contamination of the cylindrical photoreceptor is expressed in terms of number of black spots appeared on the copying paper.

The results obtained are shown in Tables 1 and 2.

EXAMPLE 2

Following substantially the same procedure as described in Example 1, an adhesive paper for copying was prepared but using a radiation polymerizable composition comprising a mixture of 100 parts by weight of a urethane acrylate oligomer having a weight-average molecular weight of 3,800 (in terms of polystyrene), 10 parts by weight of trimethylolpropane triacrylate and 1 part by weight of benzyl dimethyl ketal.

The radiation-induced polymer formed from the above-mentioned composition had a glass transition temperature of 83° C.

The thus prepared adhesive paper for copying was tested and evaluated in the same manner as in Example 1 The results obtained are shown in Tables 1 and 2.

COMPARATIVE EXAMPLE 1

An adhesive paper for copying was prepared by repeating Example 1 except that no radiation-induced polymer layer was formed on the edge face of the adhesive paper for copying, and the thus prepared adhesive paper for copying was tested and evaluated as in the same manner as in Example 1.

The results obtained are shown in Tables 1 and 2.

TABLE 1

|  | Adhesion property | Curling property | Traveling property | Image property | Effect of inhibiting squeeze out |
|---|---|---|---|---|---|
| Example 1 | Normal | Normal | Normal | Normal | Good |
| Example 2 | Normal | Normal | Normal | Normal | Good |
| Comparative Example 1 | Normal | Normal | Normal | Normal | Bad |

TABLE 2

| Number of black spots appeared on copying paper | | | | | |
|---|---|---|---|---|---|
| | Number of copying paper | | | | |
| | 0 | 50 | 100 | 150 | 200 |
| Example 1 | 20 | — | 28 | — | 31 |
| Example 2 | 20 | 21 | 25 | 22 | 29 |
| Comparative Example 1 | 20 | — | 45 | — | 60 |

From Examples 1 and 2 and Comparative Example 1, it is understood that the contamination of a cylindrical photoreceptor of copying machine can be prevented by virtue of forming on the edge face of adhesive paper for copying a radiation-induced polymer layer having a specific glass transition temperature.

EXAMPLE 3

Following substantially the same procedure as described in Example 1, an adhesive paper for copying was prepared but using a radiation polymerizable composition comprising a mixture of 100 parts by weight of a urethane acrylate oligomer having a weight-average molecular weight of 4,000 (in terms of polystyrene), 5 parts by weight of trimethylolpropane triacrylate and 0.2 part by weight of benzyl dimethyl ketal and 0.02 part by weight of a fluorescence dye (2,5-bis(5-t-butylbenzoxazolyl) (2)thiophene).

The radiation-induced polymer formed from the composition described above had a glass transition temperature of 80° C.

The adhesive paper for copying so prepared was tested and evaluated as in Example 1. It was as satisfactory as the products of Examples 1 and 2. In addition, it was easy to confirm the existence of the radiation-induced polymer layer with the product of this example.

The procedure described above was repeated except that no fluorescence dye was used. While the product obtained was as satisfactory as the products of Examples 1 and 2, it was not easy to confirm the existence of the radiation induced polymer layer.

EXAMPLE 4

Following substantially the same procedure as described in Example 1, an adhesive paper for copying was prepared but using a radiation polymerizable composition comprising a mixture of 100 parts by weight of a urethane acrylate oligomer having a weight-average molecular weight of 3,800 (in terms of polystyrene) 5 parts by weight of trimethylolpropane triacrylate and 1 part by weight of benzyl dimethyl ketal and 0.5 part by weight of a fluorescence dye (aromatic heterocyclic compound).

The radiation-induced polymer formed from the composition described above had a glass transition temperature of 80° C.

The product was as satisfactory as that of Example 3.

EXAMPLE 5

Following substantially the same procedure as described in Example 1, an adhesive paper for copying was prepared but using a radiation polymerizable composition comprising a mixture of 100 parts by weight of a urethane acrylate oligomer having a weight-average molecular weight of 4,000 (in terms of polystyrene) 5 parts by weight of trimethylolpropane triacrylate and 0.2 part by weight of benzyl dimethyl ketal and 0.1 part by weight of a dye having visible colour (Solvent Red-27).

The radiation-induced polymer formed from the composition described above had a glass transition temperature of 80° C.

The product was as satisfactory as that of Example 3.

EXAMPLE 6

Following substantially the same procedure as described in Example 1, an adhesive paper for copying was prepared but using a radiation polymerizable composition comprising a mixture of 100 parts by weight of a urethane acrylate oligomer having a weight-average molecular weight of 4,000 (in terms of polystyrene), 5 parts by weight of trimethylolpropane triacrylate and 0.2 part by weight of benzyl dimethyl ketal and 0.05 part by weight of a pigment (phthalocyanine type pigment).

The radiation-induced polymer formed from the composition described above had glass transition temperature of 80° C.

The product was as satisfactory as that of Example 3.

EXAMPLE 7

The Example illustrates that the glass transition temperature of the radiation-induced polymer can be readily modified simply by changing the monomer formulation in the radiation polymerizable composition.

A radiation polymerizable composition comprising a mixture of 100 parts by weight of urethane acrylate oligomer having a weight-average molecular weight of 2,300 (in terms of polystyrene), 100 parts by weight of oligoester acrylate having a molecular weight of about 480,70 parts by weight of N-vinyl-pyrrolidone, 8.1 parts by weight of benzyl dimethyl ketal as an initiator (3% by weight, based on the total weight of the prepolymer and monomer) and 0.13 parts by weight of a fluorescence dye, 2,5-bis(5-t-butylbenzoxazolyl-2)thiophene (0.05% by weight based on the total weight of the prepolymer and monomer), was radiation polymerized as in Example 1. The radiation-induced polymer so obtained had a glass transition temperature of 155° C.

The procedure described above was repeated except that the radiation polymerizable composition used further contained 70 parts by weight of 2-ethylhexyl acrylate; the amount of the initiator was increased to 10.2 parts by weight (3% by weight, based on the total weight of the prepolymer and monomer); and the amount of the dye was increased to 0.17 parts by weight (0.05% by weight based on the total weight of the prepolymer and monomer). The radiation-induced polymer so obtained had a glass transition temperature of 116° C.

The procedure described above was repeated except that the radiation polymerizable composition used further contained 70 parts by weight of polyethylene glycol diacrylate: the amount of the initiator was increased to 10.2 parts by weight (3% by weight, based on the total weight of the prepolymer and monomer); and the amount of the dye was increased to 0.17 parts by weight (0.05% by weight based on the total weight of the prepolymer and monomer). The radiation-induced polymer so obtained had a glass transition temperature of 117° C.

EXAMPLE 8

Following substantially the same procedure as described in Example 1, an adhesive paper for copying was prepared but using a radiation polymerizable composition comprising a mixture of 70 parts by weight of a urethane acrylate oligomer having a weight-average molecular weight of 2,300 (in terms of polystyrene), 30 parts by weight of epoxy acrylate oligomer having a weight average molecular weight of 1,700,70 parts by weight of N-vinyl-2-pyrrolidone, 60 parts by weight of 2-ethylhexyl acrylate, 6 parts by weight of benzyl dimethyl ketal and 0.1 part by weight of a fluorescence dye, 2,5- bis(5-t-butylbenzoxazolyl-2)thiophene.

The adhesive paper for copying so prepared was as satisfactory as that of Example 3.

What is claimed is:

1. In an adhesive paper for copying prepared by laminating an overlying sheet with a release sheet so that an adhesive layer coated on the bottom surface of said overlying sheet is in contact with the releasing surface of said release sheet, the improvement which comprises a radiation-induced polymer layer having a glass transition temperature ranging from 50° C. to 200° C., applied to at least one edge face of said adhesive paper for copying, said radiation-induced polymer layer being formed by applying a solvent free radiation polymerizable composition to said edge face followed by irradiation curing, said radiation polymerizable composition comprising a radiation polymerizable prepolymer and from 1 to 300 parts by weight, based on 100 parts by weight of said prepolymer, of at least one radiation polymerizable monomer, said radiation polymerizable prepolymer comprising a urethane acrylate oligomer having a molecular weight of from 1,000 to 10,000.

2. The adhesive paper for copying according to claim 1 wherein said radiation polymerizable prepolymer comprises a urethane acrylate oligomer having a molecular weight of from 1,000 to 10,000 and up to about 50% by weight, based on the weight of said prepolymer, of at least one oligomer having a molecular weight of from 1,000 to 10,000 selected from polyester acrylate, epoxy acrylate and silicone acrylate oligomers.

3. The adhesive paper for copying according to claim 1 wherein said radiation polymerizable monomer is selected from trimethylolpropane triacrylate, tetramethylolmethane tetraacrylate, pentaerythritol triacrylate, pentaerythrytol tetraacrylate, dipentaerythrytol monohydroxypentaacrylate, dipentaerythrytol hexaacrylate, 1,4-butylene glycol diacrylate, 1,6-hexanediol diacrylate, polyethylene glycol diacrylate, oligoester acrylates, N-vinyl-2-pyrrolidone, 2-ethylhexyl acrylate, nonylphenoxypolyethylene glycol acrylate and 2-hydroxyethyl acrylate.

4. The adhesive paper for copying according to claim 1 wherein said radiation polymerizable composition further comprises up to about 10% by weight, based of the weight of the composition, of a polymerization initiator.

5. The adhesive paper for copying according to claim 4 wherein said polymerization initiator is selected from 2,2-diethoxyacetophenone, bezophenone, 4,4-bisdimethylaminobenzophenone, dibenzoyl, benzoin methyl ether, benzyl dimethyl ketal, 1-hydroxycyclohexyl phenylketone and azo compounds.

6. The adhesive paper for copying according to claim 1 wherein said radiation-induced polymer layer has a glass transition temperature of from 70° C. to 150° C.

7. The adhesive paper for copying according to claim 6 wherein said radiation-induced polymer layer has a glass transition temperature of from 80° C. to 130° C.

8. In an adhesive paper for copying prepared by laminating an overlying sheet with a release sheet so that an adhesive layer coated on the bottom surface of said overlying sheet is in contact with the releasing surface of said release sheet, the improvement which comprises a radiation-induced polymer layer having a glass transition temperature ranging from 50° to 200° C., applied to at least one edge face of said adhesive paper for copying, said radiation-induced polymer layer being formed by applying a solvent free radiation polymerizable composition to said edge face followed by irradiation curing, said radiation polymerizable composition comprising a radiation polymerizable prepolymer, 1 to 300 parts by weight, based on 100 parts by weight of said prepolymer, of at least one radiation polymerizable monomer and up to about 2,0% by weight, based on the weight of the composition, of a coloring agent, said radiation polymerizable prepolymer comprising a urethane acrylate oligomer having a molecular weight of from 1,000 to 10,000.

9. The adhesive paper for copying according to claim 8 wherein said coloring agent is selected from dyes having visible color, fluorescence dyes and pigments.

10. The adhesive paper for copying according to claim 8 wherein said radiation polymerizable prepolymer comprises a urethane acrylate oligomer having a molecular weight of from 1,000 to 10,000 and up to about 50% by weight, based on the weight of said prepolymer, of at least one oligomer having a molecular weight of from 1,000 to 10,000 selected from polyester acrylate, epoxy acrylate and silicone acrylate oligomers.

11. The adhesive paper for copying according to claim 8 wherein said radiation polymerizable monomer is selected from trimethylolpropane triacrylate, tetramethylolmethane tetraacrylate, pentaerythritol triacrylate, pentaerythrytol tetraacrylate, dipentaerythrytol monohydroxypentaacrylate, dipentaerythrytol hexaacrylate, 1,4-butylene glycol diacrylate, 1,6-hexanediol diacrylate, polyethylene glycol diacrylate, oligoester acrylates, N-vinyl-2-pyrrolidone, 2-ethylhexyl acrylate, nonylphenoxypolyethylene glycol acrylate and 2-hydroxyethyl acrylate.

12. The adhesive paper for copying according to claim 8 wherein said radiation polymerizable composition further comprises up to about 10% by weight, based of the weight of the composition, of a polymerization initiator.

13. The adhesive paper for copying according to claim 12 wherein said polymerization initiator is selected from 2,2-dietoxyacetophenone, bezophenone, 4,4-bisdimethylaminobenzophenone, dibenzoyl, benzoin methyl ether, benzyl dimethyl ketal, 1-hydroxycyclohexyl phenylketone and azo compounds.

14. The adhesive paper for copying according to claim 8 wherein said radiation-induced polymer layer has a glass transition temperature of from 70° to 150° C.

15. The adhesive paper for copying according to claim 14 wherein said radiation-induced polymer layer has a glass transition temperature of from 80° to 130° C.

* * * * *